(12) United States Patent
Gustavsson et al.

(10) Patent No.: US 8,384,475 B2
(45) Date of Patent: Feb. 26, 2013

(54) COMPOSITE AMPLIFIER, A RADIO TERMINAL AND A METHOD FOR IMPROVING THE EFFICIENCY OF THE COMPOSITE AMPLIFIER

(75) Inventors: Ulf Gustavsson, Gothenburg (SE); Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 12/741,432

(22) PCT Filed: Nov. 19, 2007

(86) PCT No.: PCT/SE2007/050866
§ 371 (c)(1),
(2), (4) Date: May 5, 2010

(87) PCT Pub. No.: WO2009/067054
PCT Pub. Date: May 28, 2009

(65) Prior Publication Data
US 2010/0244949 A1     Sep. 30, 2010

(51) Int. Cl.
*H03F 3/68* (2006.01)
(52) U.S. Cl. .................... 330/124 R; 330/295
(58) Field of Classification Search .............. 330/124 R, 330/295
See application file for complete search history.

(56) References Cited

U.S. PATENT DOCUMENTS

| | | | |
|---|---|---|---|
| 6,825,719 B1 * | 11/2004 | Barak et al. | 330/129 |
| 7,064,606 B2 * | 6/2006 | Louis | 330/124 R |
| 7,221,219 B2 | 5/2007 | Hellberg et al. | |
| 7,417,508 B1 * | 8/2008 | Quaglietta | 330/302 |
| 2006/0103466 A1 | 5/2006 | Shah et al. | |
| 2006/0114060 A1 | 6/2006 | Hellberg et al. | |

FOREIGN PATENT DOCUMENTS
EP     1583228 A2     10/2005

OTHER PUBLICATIONS

El-Asmar, M. et al. "Improving Chireix Combiner Efficiency using MEMD Switches." IEEE CCECE/CCGEI, Ottawa, May 2006.
Edmund Neo, W. C. et al. "Adaptive Multi-Band Multi-Mode Power Amplifier using Integrated Varactor-Based Tunable Matching Networks." IEEE Journal of Solid-State Circuits, vol. 41, No. 9, Sep. 2006.

* cited by examiner

*Primary Examiner* — Robert Pascal
*Assistant Examiner* — Khiem Nguyen
(74) *Attorney, Agent, or Firm* — Coats & Bennett, P.L.L.C.

(57) ABSTRACT

The present invention relates to a composite amplifier (3, 4, 120), a radio terminal (100) including such composite amplifier and to a method for improving the efficiency of such composite amplifier in particular. The composite amplifier according to embodiments of the present invention is arranged to be connected to an output combiner network (43, 53, 63, 73, 83) and to a load (49, 130). the output combiner network comprising at least one dynamically tuneable reactance (47, 48). The instantaneous efficiency of the composite amplifier (3, 4, 120) is increased by tuning the impedances/admittances seen by each of said at least two power amplifiers (41, 42, 71, 72). The amplifiers being differently driven and they may further be part of a Chireix outphasing system or a pair of a Doherty amplifier.

6 Claims, 16 Drawing Sheets

COMPOSITE AMPLIFIER, A RADIO TERMINAL AND A METHOD FOR IMPROVING THE EFFICIENCY OF THE COMPOSITE AMPLIFIER

TECHNICAL FIELD

The present invention relates to power amplifiers in general and to a composite amplifier, a radio terminal including such composite amplifier and to a method for improving the efficiency of such composite amplifier in particular.

BACKGROUND

Power amplifiers usually used in radio transmitters for broadcast, cellular, and satellite systems, are indispensable components that have to be efficient and linear, in addition to being able to simultaneously amplify many radio channels (frequencies) or independent user data channels, spread across a fairly wide bandwidth. A power amplifier, such as a radio frequency (RF) power amplifier, also has to perform amplifications efficiently in order to reduce power consumption and to increase its longevity. High linearity is required because a non-linear input-output signal characteristic of a power amplifier often results in a broadened spectrum around the desired amplified signal, and an unwanted in-band component of the signal, which lead to bad system performance especially in multicarrier telecommunications systems (e.g. WCDMA) which are known to be particularly sensitive to the effects of non-linearities.

To decrease the effects of non-linearity, several linearization schemes could be used. One such linearization scheme is known as feed-forward, where a signal is injected after the amplifier that cancels the non-idealities. Another linearization scheme usually used is to predistort (modify) the signal at the input of the amplifier in order to give an undistorted amplified signal at the output of the amplifier. This technique is called predistortion.

An additional important key factor of RF power amplifiers used in multicarrier telecommunications systems (e.g. WCDMA) is as mentioned above, the amplifier efficiency.

The amplifier efficiency must be kept high in order to reduce the need for cooling as well as the overall power consumption, and to increase the lifetime of the power amplifier. Conventional power amplifiers have low efficiency especially when transmitting signals with a large peak-to-average power ratio. As an example, a wideband signal generally has an average power (amplitude) that is normally much smaller than the peak power (amplitude) and since a conventional linear RF power amplifier generally has an efficiency that is proportional to its output amplitude, its average efficiency is consequently very low for such signals having a large peak-to-average power ratio.

In response to the low efficiency of conventional linear power amplifiers when transmitting signals with a large peak-to-average power ratio, two methods or two amplifier structures have been widely utilized. The Doherty amplifier (or the Doherty amplification method), is described in W. H. Doherty, "*A new high efficiency power amplifier for modulated waves,*" Proc. IRE, vol. 24, no. 9, pp. 1163-1182, September 1936, and the Chireix outphasing system (or the Chireix amplification method) is described in H. Chireix, "*High power outphasing modulation*", Proc. IRE, vol. 23, no. 11, pp. 1370-392, November 1935.

The Doherty amplifier uses one non-linear and one linear amplifier. A first power amplifier is driven as a linear amplifier in class B, and a second power amplifier having non-linear output current modulates the impedance seen by the first amplifier, through an impedance-inverting quarter wave line. Since the non-linear output current of the second power amplifier is zero below a certain output voltage, the second power amplifier does not contribute to power loss below this voltage.

The Doherty amplifier's output power level back-off where the efficiency reaches a maximum in the efficiency curve of the Doherty amplifier is at half the maximum output voltage. The location of the output power level back-off can be changed by changing the impedance of the quarter-wave transmission line (or transformation (matching) network). Thus the size of the transformation (matching) dictates the location of the lower efficiency maximum of the Doherty power amplifier. Even though the Doherty amplifier can be extended to three or more amplifiers in order to obtain more maximum points on the efficiency curve, this usually leads to a requirement for very unevenly sized amplifiers i.e. transistors.

The principal of the Chireix outphasing system is to create amplitude modulation using two amplifiers operating at constant amplitude together with a special type of combining network. By altering the differential phase-shift between the two amplifiers, amplitude modulation is created. The combination of generally two phase modulated constant amplitude signals thus enables amplitude modulation. After up-conversion and amplification through RF chains (e.g. mixers, filters and amplifiers), the signals are combined to form an amplified signal in an output combiner network. The phases of these constant amplitude signals are chosen so that the result from their vector-summation yields the desired amplitude. The compensation reactances, denoted +jX and −jX respectively, in the output network of the Chireix amplifier, are used to extend the region of high efficiency to include lower output power levels. The efficiency of Chireix systems is derived in R. F. Raab, "*Efficiency of outphasing RF power amplifier systems*", IEEE Trans. Communications, vol. COM-33, no. 10, pp. 1094-1099. October 5.

An advantage with the Chireix amplifier is the ability to change the efficiency curve to suit different peak-to-average ratios. The peak output power is equally divided between the amplifiers irrespective of this adjustment, which means that equal size amplifiers can be used. The change of the efficiency curve may be performed by changing (tuning) the size of the reactances (X) in order to tune a combining network of a Chireix amplifier, thus achieving peak efficiency at an average output power. This approach is proposed in M. El-Asmar, A. B. Kouki "*Improving Chireix Combiner Efficiency Using MEMS Switches*", IEEE CCECE/CCGEI, Ottawa, pages 2310-2313, May 2006.

In the above mentioned prior art publication, the length of tuning stubs that are used to create the compensation reactances for the Chireix combiner, is varied. The response time of MEMS (Micro Electro Mechanical System) switches are used to connect and disconnect the different stubs (usually two) at the input of the combiner. This exchange of the two stubs occurs at a fixed level of the phase between the two input signals in order to increase the efficiency of the Chireix power amplifier. MEMS-switches are however mechanical devices which means reliability issues over time. Furthermore, the switches available today are commonly quite small and thus will be severely affected by the amount of power passed through the combiner network from each amplifier of the Chireix amplifier. In addition, finite switch time may cause additional problems by introducing "jumps" by the load seen from each amplifier thus affecting the efficiency of the amplifier.

In general, the Chireix and Doherty amplifiers have efficiency maxima at some fixed medium output levels. This is considered optimal for some fixed signal amplitude distribution but less than optimal for all other. This is due to that the efficiency getting lower moving away from these signal envelope amplitudes.

In the U.S. Pat. No. 7,221,219, a composite power amplifier structure is suggested which essentially is based on a combination of the auxiliary amplifier of a Doherty amplifier and at least one pair of amplifiers forming a Chireix pair. The Doherty part of the composite amplifier is driven in the same manner as the auxiliary amplifier of a Doherty amplifier. Each Chireix pair is driven by drive signals having amplitude dependent phase over at least a part of the dynamic range of the composite amplifier. In this prior art document, the efficiency of the composite amplifier is improved by letting the different pairs have amplitude dependent phase in different part of the dynamic range of the composite amplifier.

Another method of improving the average efficiency of a RF power amplifier is by dynamically adjusting a matching network of the RF power amplifier. However, the dynamic matching components of the matching network may be slow, may lose efficiency above those of fixed components and/or may require significant power in order to perform the adjustment since the power is generally proportional to the bandwidth of the adjustment/tuning process.

SUMMARY

An object of the present invention is thus to obviate at least some of the above disadvantages by providing a procedure for improving the instantaneous efficiency of a composite amplifier. The composite amplifier according to the present invention comprises at least two power amplifiers which are differently driven and which may be configured to be a pair of a Chireix outphasing system or a pair of a Doherty amplifier.

According to a first aspect of the invention, the above stated problem is solved by means of an apparatus in terms of a composite amplifier for use in a radio terminal of a telecommunications system, the composite amplifier comprising at least two power amplifiers that are differently driven and that are further arranged to be connected to an output combiner network and to a load, the output combiner network comprising at least one dynamically tuneable reactance. In order to increase the instantaneous efficiency of the composite amplifier in accordance with the present invention, at least one of the impedances seen by each of the at least two differently driven power amplifiers are configured to be dynamically tuned.

According to another aspect of the present invention, the above stated problem is solved by means of a method for improving the instantaneous efficiency of a composite amplifier comprising at least one dynamically tuneable reactance and further comprising at least two differently driven power amplifiers being connected to an output combiner network and to a load. The method comprising: dynamically tuning at least one of the impedances seen by each of the at least two differently driven power amplifiers such that the instantaneous efficiency of the composite amplifier is increased.

According to yet another aspect of the present invention, the above stated problem is solved by means of a radio terminal comprising a composite amplifier according to the above mentioned composite amplifier.

An advantage of the present invention is that the efficiency degradation due to voltage overhead associated with a dynamic matching amplifier with slow tuning components can be mitigated since the use of slow dynamic matching components requires the allocation of headroom for the signal to account for quick excursions of the amplitude. Thus, a separate allocation of headroom is not necessary in a composite amplifier according to the present invention.

Another advantage of the present invention is that the instantaneous efficiency of the composite amplifier that is comprised of amplifiers which may be configured to be a pair of a Chireix outphasing system or a pair of a Doherty amplifier, is improved since a Chireix amplifier or a Doherty amplifier has an efficiency maximum some bit below the peak output amplitude point, meaning that the efficiency of the composite amplifier can be maximized over a longer time than that of the envelope amplitude fluctuations of the output signal and still have amplitude headroom for quick upward excursions. Thus, in accordance with the present invention, the composite amplifier in accordance with the present invention enables decoupling the efficiency maximum from the amplitude maximum.

Yet another advantage of the present invention is that reliability performance due to non-mechanical operations is increased.

A further advantage of the present invention compared to e.g. the previously described MEM-solution, is that the use of dynamically tuneable reactances in accordance with the present invention, provides an improvement in the instantaneous efficiency of the composite amplifier compared to the use of MEMS-switches. Although more MEMS-switches may provide high efficiency, they also increase the reliability risks contrary to solutions provided by the present invention.

The present invention will now be described in more details by means of several embodiments and with reference to the accompanying drawings, attention to be called to the fact, however, that the following drawings are illustrative only, and that various modifications and changes may be made in the specific embodiments illustrated as described within the scope of the appended claims.

DETAILED DESCRIPTION

In the following description, for purposes of explanation and not limitation, specific details are set forth such as particular architectures, scenarios, techniques, etc. in order to provide thorough understanding of the present invention. However, it will be apparent from the person skilled in the art that the present invention and its embodiments may be practiced in other embodiments that depart from these specific details.

The present invention is described herein by way of reference to particular example scenarios. In particular the invention is described in a non-limiting general context in relation to an exemplary WCDMA single carrier signal having a predetermined peak-to-average power ratio (PAPR) (e.g. 7 dB PAPR). Note again that the present invention and its exemplary embodiments are by no means restricted to the above mentioned WCDMA single carrier signal i.e. multicarrier or single carrier signals of other type of systems may be used. In addition, the present invention is described in a non-limiting general context in relation to a composite amplifier comprising at least two power amplifiers which may be configured to be a pair of a Doherty amplifier or a pair of a Chireix outphasing system.

Figure 1A:
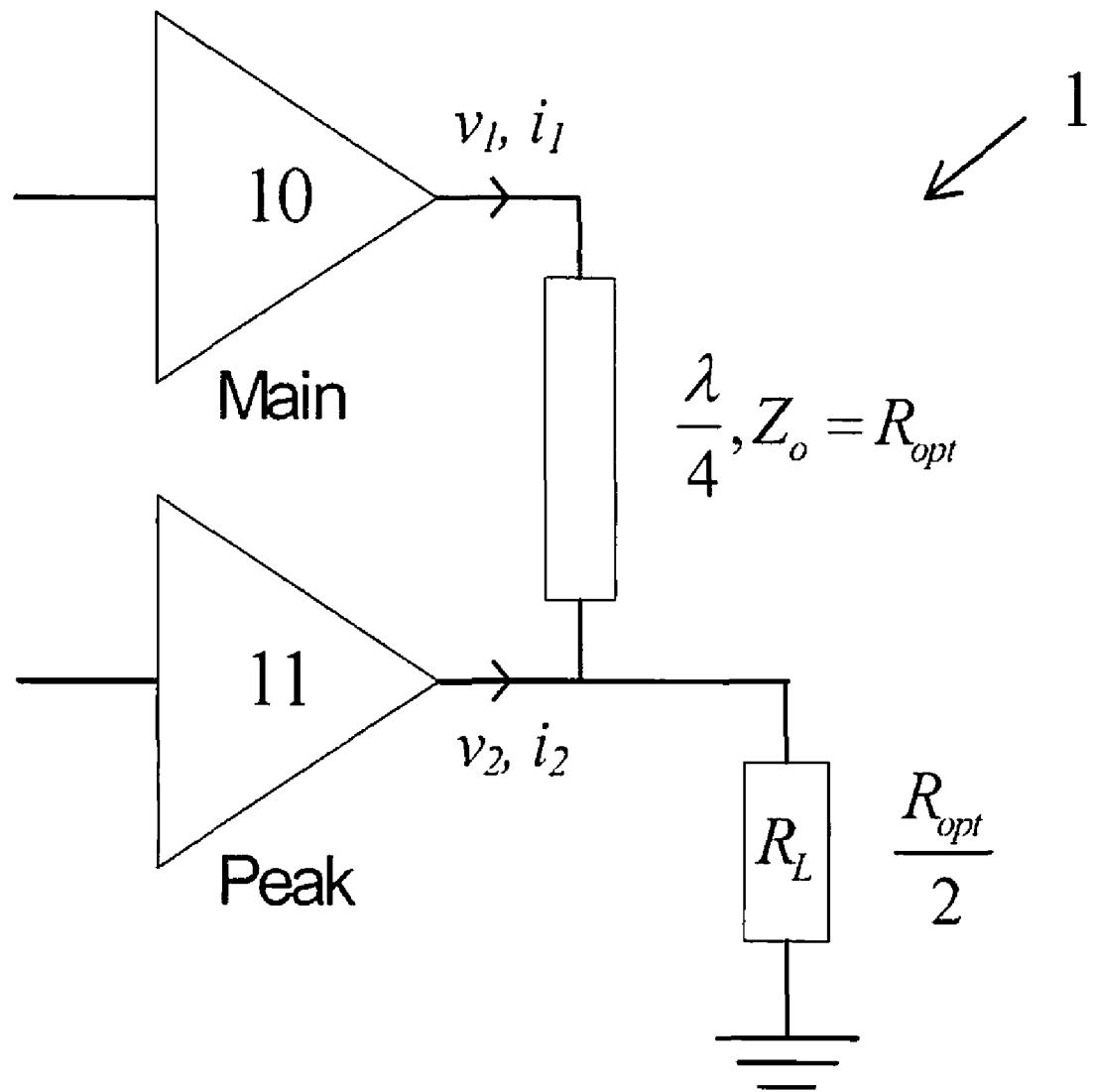
FIG. 1A is a block diagram illustrating the principles of a prior art Doherty amplifier.
Figure 1B:
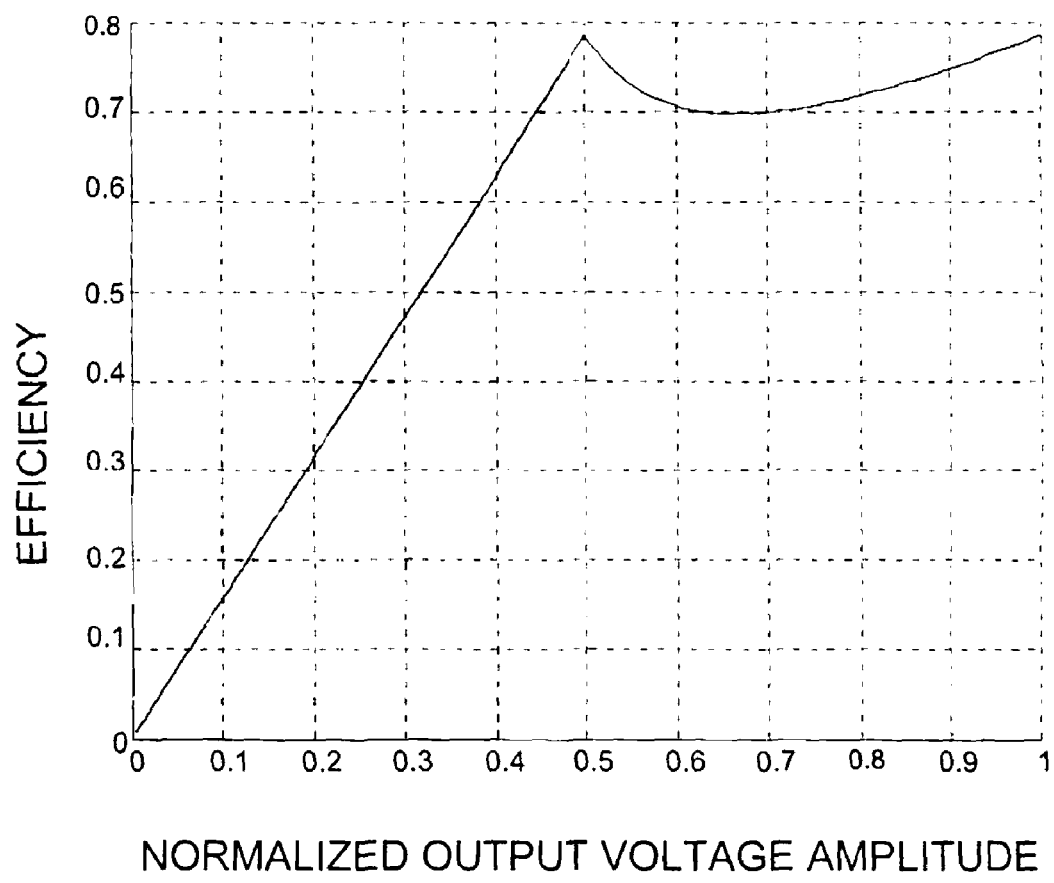
FIG. 1B is a schematic diagram illustrating the efficiency of a prior art Doherty amplifier.

Referring to FIG. 1A there is illustrated a block diagram of a typical prior art Doherty amplifier 1. A Doherty amplifier consists of two amplifiers called the main amplifier 10 and the peak amplifier 11. The main and peak amplifiers 10, 11 are illustrated as equally large, even though they do not have to be of equal size. As illustrated in FIG. 1A, the two amplifiers are connected by a quarter-wave transmission line with characteristic impedance $Z_o$. The output of the peak amplifier is additionally connected to a load $R_L$. It is here assumed that both amplifiers 10 and 11 act as ideal controlled generators, i.e. the output currents ($i_1$ and $i_2$) are proportional to an input drive signal. If we now assume that the optimal load resistance of one of the amplifiers is $R_{opt}$, then, the load resistance should equal $R_{opt}/2$, so that the maximum deliverable power is twice that of a single amplifier. The role of the transmission line is to transform the load resistance to $2R_{opt}$ at the output of the main amplifier. If we assume that the output impedance of the main amplifier is infinite, the impedance seen by the peak amplifier 11 will be zero due to the impedance inverting characteristics of the transmission line. At a low output level, the peak amplifier is completely turned off and presents infinite output impedance. This means that the RF voltage on the main amplifier ($v_1$) rises twice as fast when we increase the current ($i_1$) as for a conventional amplifier (the load resistance is $2R_{opt}$ as compared to $R_{opt}$), giving about twice the efficiency. At some point, called the transition point, this voltage has reached its maximum, with a corresponding maximum in efficiency. When saturation is reached, the Doherty amplifier 1 starts driving current from the peak amplifier 11, which is transformed through the transmission line to a voltage on the main amplifier 10. By selecting the phase of $i_2$ to lag 90 degrees behind that of $i_1$, the voltage contribution to $v_1$ from the peak amplifier 11 will be 180 degrees out of phase from the contribution from the main amplifier 10. This means that the voltage $v_1$ remains constant as we gradually increase $i_1$ and $i_2$. Since the load resistance seen by the peak amplifier 11 is zero, the voltage $v_2$ is not affected by $i_2$, but will instead equal $R_{opt}i_1$. The resulting efficiency of a prior art Doherty amplifier is illustrated in FIG. 1B.

Figure 2A:
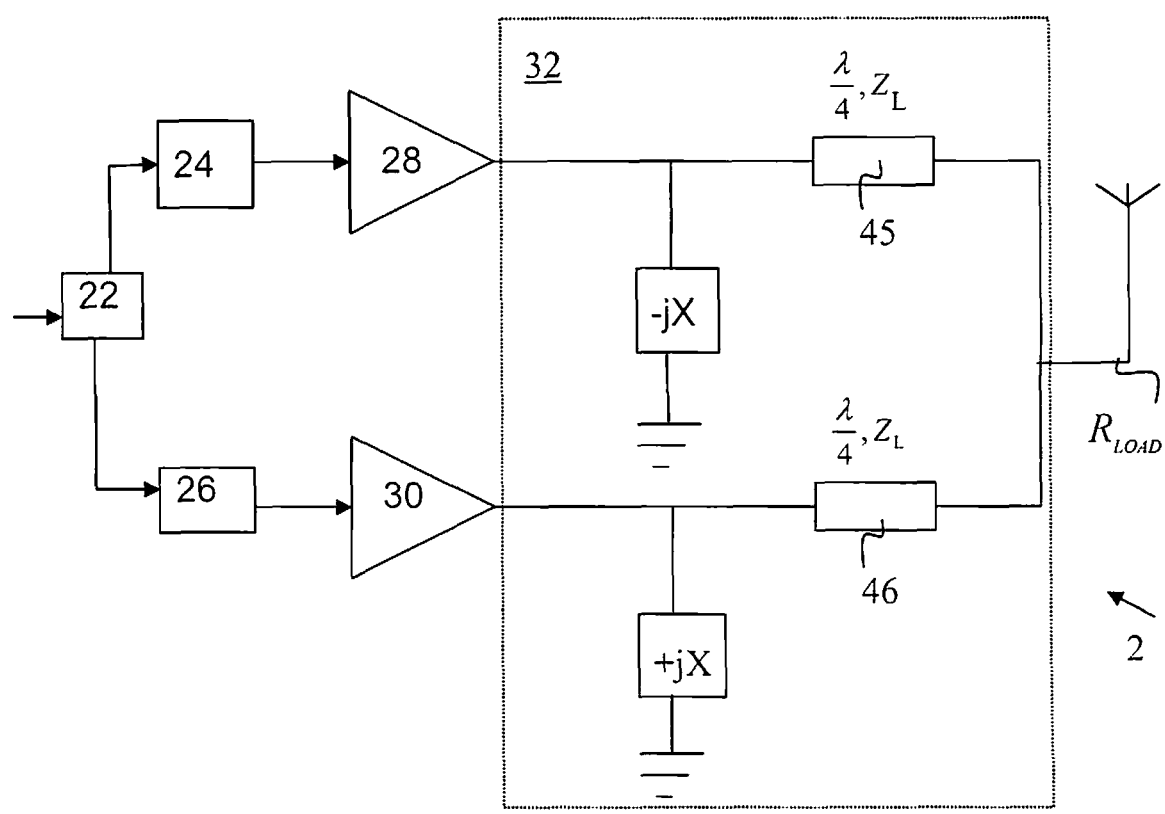
FIG. 2A is a block diagram illustrating the principles of a prior art Chireix outphasing system.
Figure 2B:
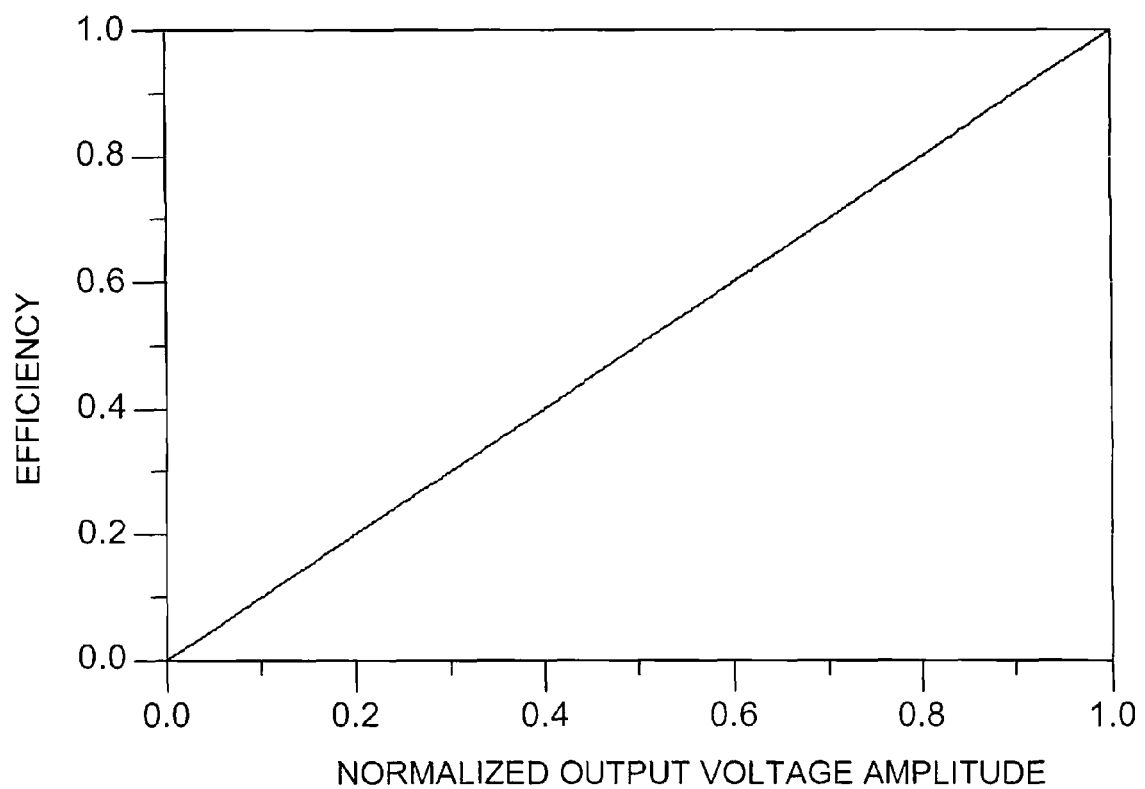
FIG. 2B is a schematic diagram illustrating the efficiency of a prior art Chireix outphasing system without compensating reactances.

Referring to FIG. 2A there is illustrated a block diagram of a typical prior art Chireix outphasing system 2. The term outphasing, which is the key method in Chireix and LINC (linear amplification with non-linear components) amplifiers, generally means the method of obtaining amplitude modulation by combining two phase-modulated constant-amplitude signals produced in a signal component separator 22. After up-conversion and amplification through RF chains 24, 26 (e.g. mixers, filters, amplifiers) and power amplifiers 28 and 30, the outphased signals are combined to form an amplified linear signal in a Chireix type output combiner network 32. The phases of these constant amplitude outphased signals are chosen so that the result from their vector-summation yields the desired amplitude. The Output combiner network 32 includes two quarter-wave lines λ/4 (where λ represents the wavelength of the center frequency of the frequency band at which the amplifier is operated) and two compensating reactances, denoted +jX and −jX, which are used to extend the region of high efficiency to include lower output power levels. Also illustrated in FIG. 2A is a load $R_{LOAD}$ which in FIG. 2A represents an antenna. The efficiency of a prior art Chireix outphasing system without compensating reactances is illustrated in FIG. 2B.

Generally, power amplifiers are modeled as comprising a matching or a combiner network that is characterized by at least one impedance/admittance seen from one of several power amplifiers and/or by at least one transimpedance from one of several power amplifiers to an output node.

As an example, the combiner network of a Doherty amplifier may be characterized by the impedance seen by the main amplifier as a function of both the characteristic impedance of the transmission line and the load impedance $R_L$ that is connected to the combiner network. For the Chireix outphasing system, the combiner network may be characterized by the quarter-wave transmission lines together with the reactances +jX and −jX. As an example, the impedance/admittance seen by one of the amplifiers of the Chireix outphasing system may be expressed as a function of the reactance +jX or −jX and the load impedance $R_L$ that is connected to the combiner network.

In the following, exemplary embodiments of a composite amplifier according to the present invention are presented. The exemplary composite amplifier may comprise at least two power amplifiers which may be configured to be a pair of a Doherty amplifier or a pair of a Chireix outphasing system. In both cases, the combiner network of the composite amplifier comprises at least one dynamically tuneable reactance and the power amplifiers are configured to be differently driven. The instantaneous efficiency of the composite amplifier is, according to embodiments of the present invention, increased by dynamically tuning at least one of the impedances seen by each of the power amplifiers.

Figure 3A:
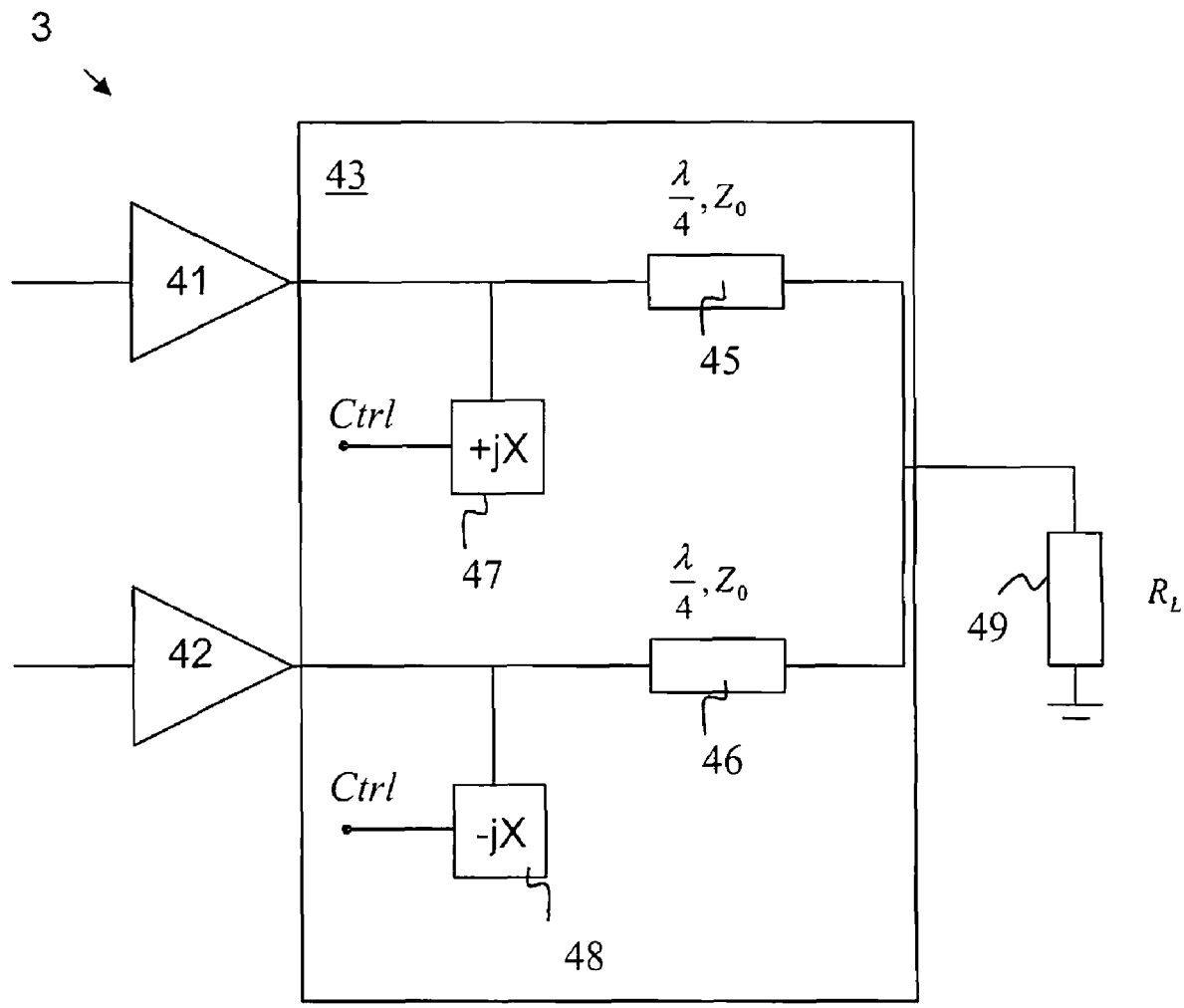
FIG. 3A is a block diagram illustrating a general structure of an exemplary composite amplifier in accordance with an exemplary embodiment of the present invention.

FIG. 3A illustrates a general schematic view of a composite amplifier 3 according to an exemplary embodiment of the present invention. The composite amplifier of FIG. 3A is here considered to comprise a Chireix outphasing system including two differently driven amplifiers 41 and 42 that are connected to a combiner network 43. The Combiner network 43 is represented by two quarter-wave transmission lines 45 and 46 having characteristic impedances $Z_0$. The combiner network 43 further comprises two dynamically tuneable reactances (−jX) 47 and (+jX) 48 that are controlled. The combiner network 33 is also connected to a load ($R_L$) 49.

According to an embodiment of the present invention, the impedance $Z_1$ seen by e.g. power amplifier 41 and the impedance $Z_2$ seen by amplifier 42 may be dynamically tuned in order to increase the instantaneous efficiency of the composite amplifier 3. The tuning/retuning may be performed by dynamically tuning/retuning reactances 47 and 48 i.e. by dynamically tuning/retuning −jX and +jX. Note here that in the case of a Chireix outphasing system, the dynamically tuneable reactances −jX and +jX (or similarly the impedance/admittance seen by each of the amplifiers) are a function of an outphasing angle denoted here φ.

As is well known in the art, an admittance Y can be defined by Y=G+jB, where G is a conductance and B is a susceptance. The admittance can also be written as the inverse of the impedance Z i.e.:

$$Y = \frac{1}{Z} = \frac{1}{R + jX} \quad (1)$$

where R is a resistance and X a reactance. The impedance may therefore be written as:

$$Z = \frac{1}{Y} = \frac{1}{G + jB} \quad (2)$$

Figure 3B:
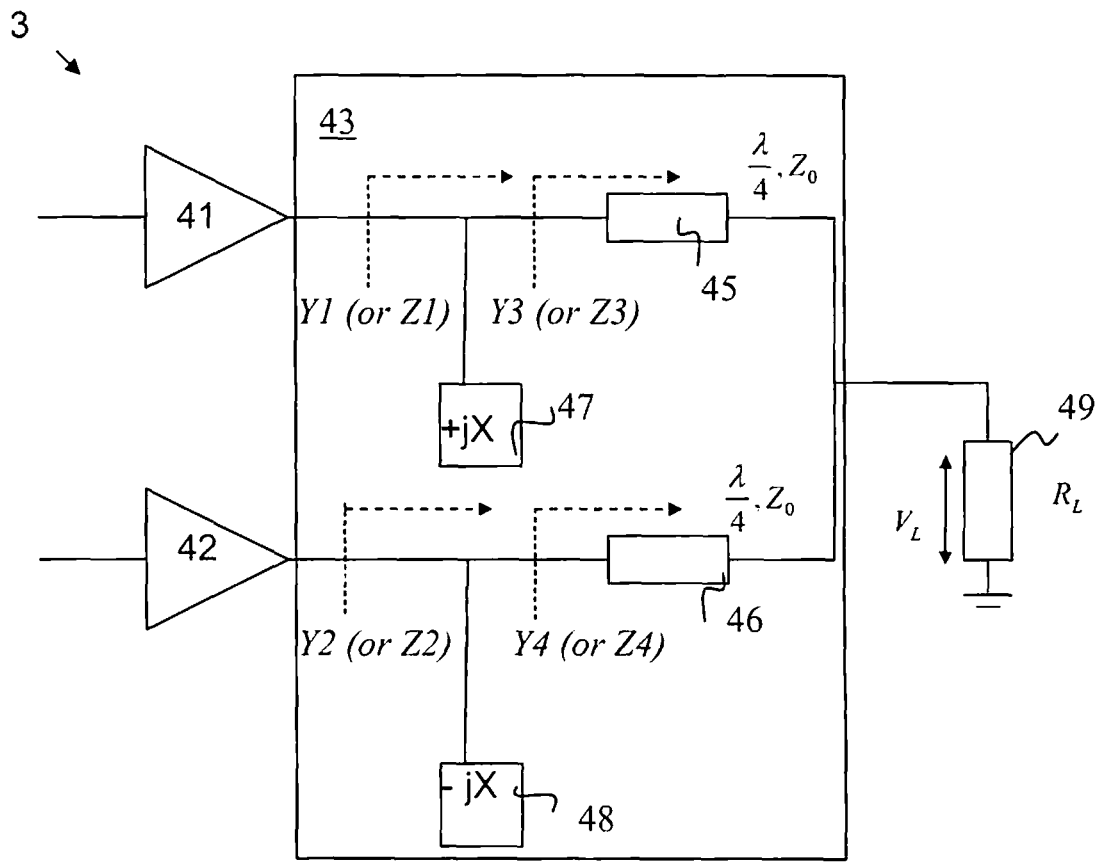
FIG. 3B is a block diagram illustrating the general structure of FIG. 3A including the impedances/admittances seen by the amplifiers.

Referring to FIG. 3B, there are illustrated four admittances $Y_1, Y_2, Y_3, Y_4$, where $Y_1, Y_3$ are seen by amplifier 41 and $Y_2, Y_4$ are admittances seen by amplifier 42, The admittance $Y_3$ seen by amplifier 41 and the admittance $Y_4$ seen by amplifier 42 may be expressed according to the following expressions:

$$\begin{cases} Y_3 = \frac{2R_L}{Z_0^2} \cdot \frac{V_L}{V_{PEP}}(\sin\varphi + j\cos\varphi) \\ Y_4 = \frac{2R_L}{Z_0^2} \cdot \frac{V_L}{V_{PEP}}(\sin\varphi - j\cos\varphi) \end{cases} \quad (3)$$

Where $V_{PEP}$ is here considered to be a normalized maximum peak voltage (PEP—Peak Envelope Power), is the voltage over the load $R_L$ 49. $Z_0$ is the characteristic impedance of the quarter-wave transmission-line in the combiner network and φ represents the outphasing angle of the Chireix power amplifier system.

According to embodiments of the present invention, by placing shunt-reactances (−jX and +jX) as shown in FIG. 3A or FIG. 3B, one can achieve resonance with the reactive load seen by each amplifier 41, 42 by altering e.g. φ. We express this as a susceptance B in the following manner:

$$B = \frac{2R_L}{Z_0^2} \cdot \frac{V_L}{V_{PEP}} \sqrt{1 - \left(\frac{V_L}{V_{PEP}}\right)^2} \quad (4)$$

The normalized susceptance may be written as B' and may be expressed according to the following equation:

$$B' = B \cdot \frac{Z_0^2}{2R_L} \quad (5)$$

The admittance $Y_1$ seen by amplifier 41 and the admittance $Y_2$ seen by amplifier 42 may further be expressed as a function of the susceptance B according to the following expression:

$$\begin{cases} Y_1 = Y_3 - jB \\ Y_2 = Y_4 + jB \end{cases} \quad (6)$$

For φ±0 $Y_1$ and $Y_2$ are entirely real as $\text{Im}(Y_3)=+jB$ and $\text{Im}(Y_4)=-jB$. This would not be the case if −jX and +jX are not present.

Using the above expressions of the admittances $Y_1$ and $Y_2$, we can, according to embodiments of the present invention, directly derive the expressions of the impedances $Z_1$ and $Z_2$, where $Z_1$ represents the impedance seen by amplifier 41 and $Z_2$ represents the impedance seen by amplifier 42. $Z_1$ and $Z_2$ are given according to the following expressions:

$$\begin{cases} Z_1 = \frac{1}{Y_1} = \frac{1}{Y_3 - jB} \\ Z_2 = \frac{1}{Y_2} = \frac{1}{Y_4 + jB} \end{cases} \quad (7)$$

From this, we can express +jX and −jX according to the following:

$$jX = j\omega L = \frac{1}{j\omega C} \Rightarrow jB = \frac{1}{j\omega L} = j\omega C \quad (8)$$

Where $\omega=2\pi f_c$ being a function of the center frequency $f_c$; L is an inductance and C is a capacitance.

It should be noted that we can use admittances $Y_1$ and $Y_2$ instead of impedances $Z_1$ and $Z_2$. In FIG. 3B, the admittances (or the impedances) seen by the amplifiers 41 and 42 are depicted. The voltage $V_L$ over the load $R_L$ 49 is also shown.

It should also be noted that the input signal (not shown) to amplifier 41 can be expressed as $$\frac{A}{2}\cos(\omega t - \varphi(t)),$$

where A is the amplitude of the input signal, and the input signal (not shown) to amplifier 42 can similarly be expressed as $$\frac{A}{2}\cos(\omega t + \varphi(t)).$$

These signals may, as previously described in conjunction to FIG. 2A, be produced by a signal separator.

According to an embodiment of the present invention, the efficiency η of the composite amplifier 3 can be modeled using the following expression:

$$\eta = \frac{1}{\sqrt{1 + \frac{1}{4}\left(\frac{\sin(2\varphi) - B'_c}{\sin^2(\varphi)}\right)^2}} \quad (9)$$

where $B'_c$, as mentioned earlier, represents the normalized susceptance, which in this example is capacitive.

For a dynamic Chireix outphasing system in accordance to the present invention, the impedances seen by the power amplifiers, which are a function of the tuneable reactances −jX and +jX may be dynamically tuned by dynamically tuning these reactances. The instantaneous efficiency of the composite amplifier is consequently increased.

The instantaneous efficiency (bottom figures) of the composite amplifier for different tuning of the impedance(s)/admittances seen by each amplifier and the corresponding Smith diagrams (top figures) are illustrated in FIGS. 4A-4D.

Figure 4A:
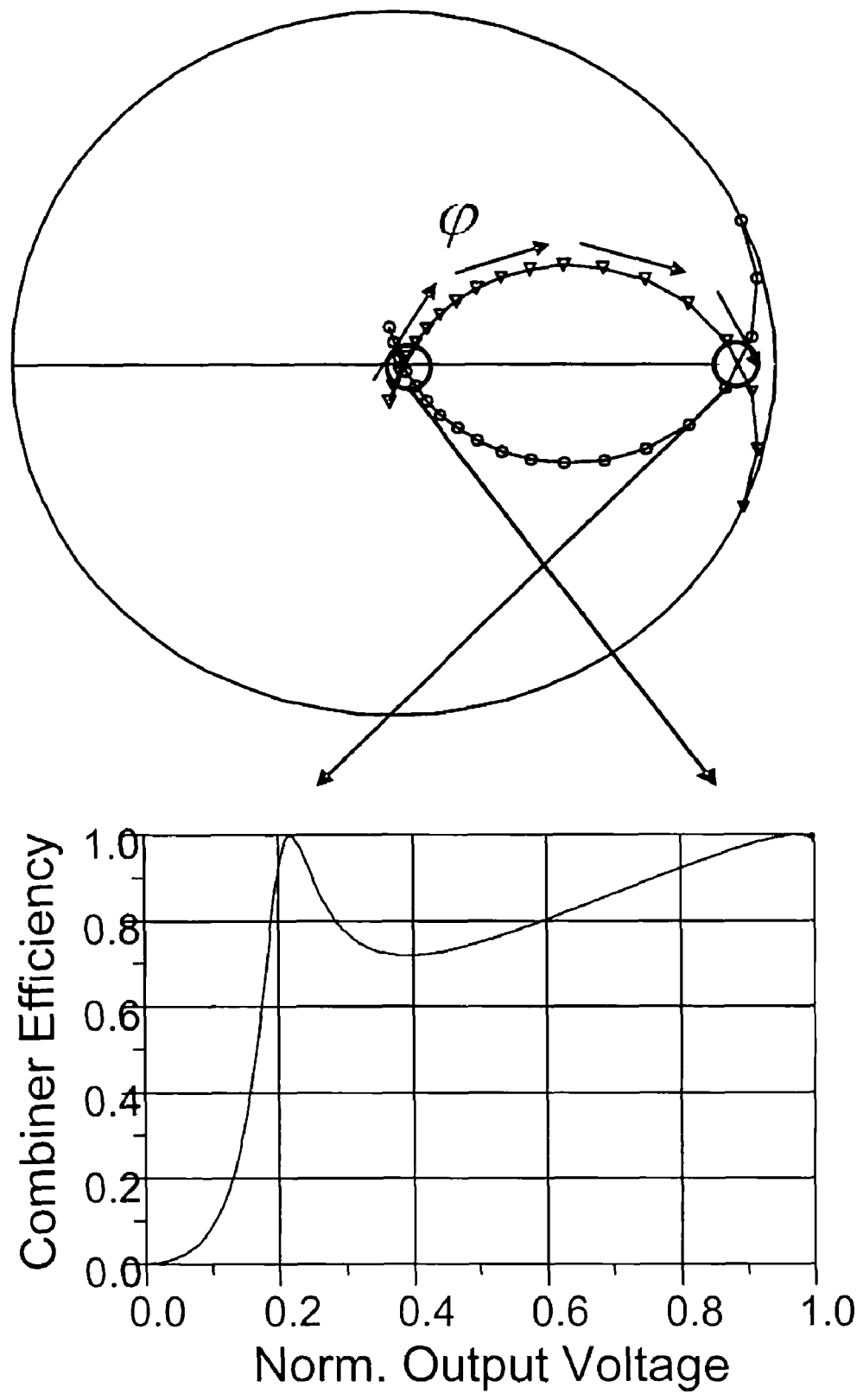
FIGS. 4A-4D schematically illustrate examples of the efficiency of a composite amplifier including a Chireix outphasing system in accordance with embodiments of the present invention and further illustrate corresponding Smith diagrams.

FIG. 4A illustrates an exemplary scenario when the peak efficiency is achieved as the outphasing angle φ increases at the points where the two load trajectories cross each other over the real line (see the Smith diagram). FIG. 4A also shows that by increasing φ, the output power is decreased. The direction of increase of φ is illustrated by the arrow pointing towards the origin. In FIG. 4A there are also illustrated two normalized output power levels where the instantaneous efficiency reaches local maxima. The two efficiency peaks occur when both amplifier load impedance trajectories simultaneously cross each other over the real line (horizontal line) in the Smith diagram.

Figure 4B:
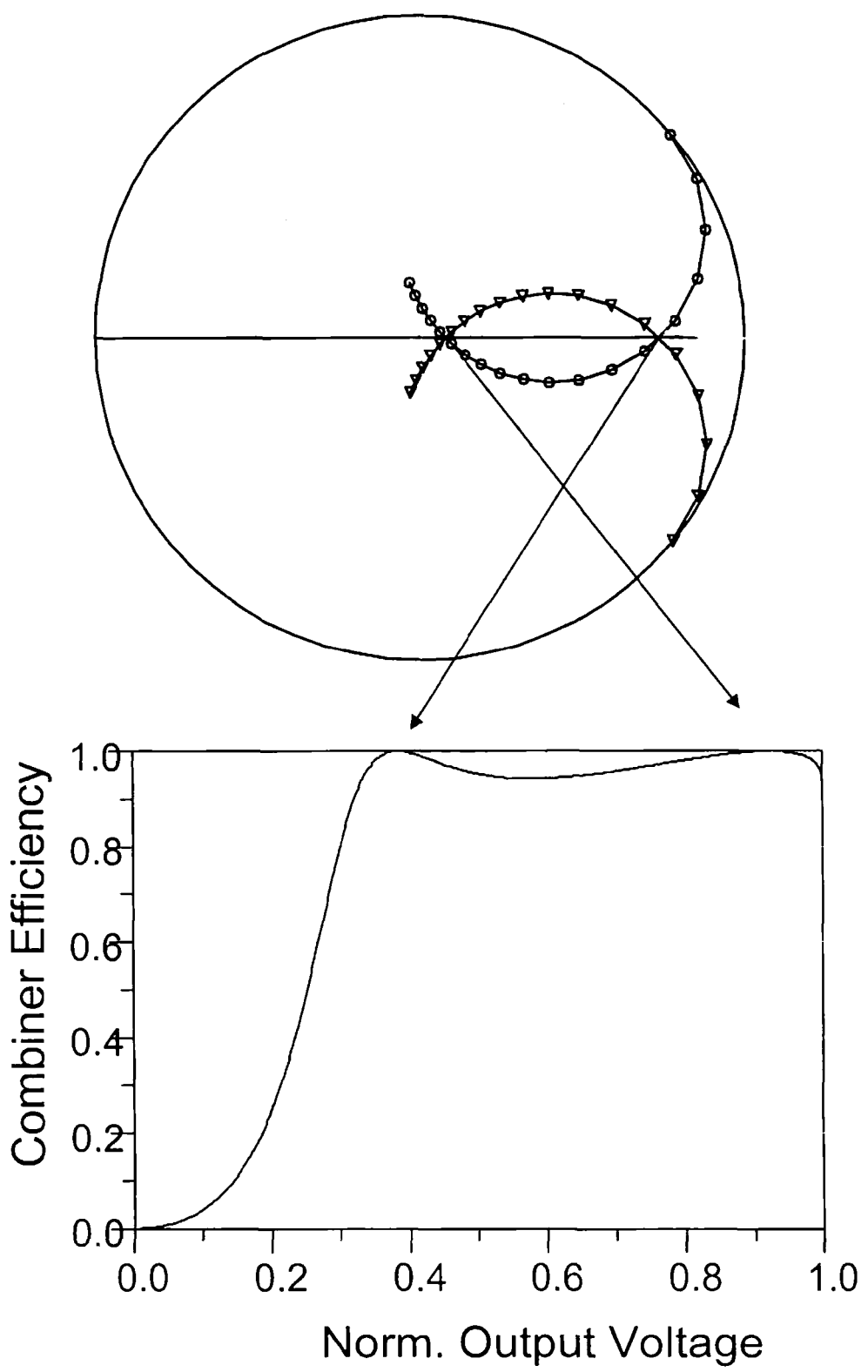

FIG. 4B illustrates another exemplary scenario when the peak efficiency is achieved as the outphasing angle φ further increases. In FIG. 4B, there are also illustrated two normalized output power levels where the instantaneous efficiency reaches local maxima.

Figure 4C:
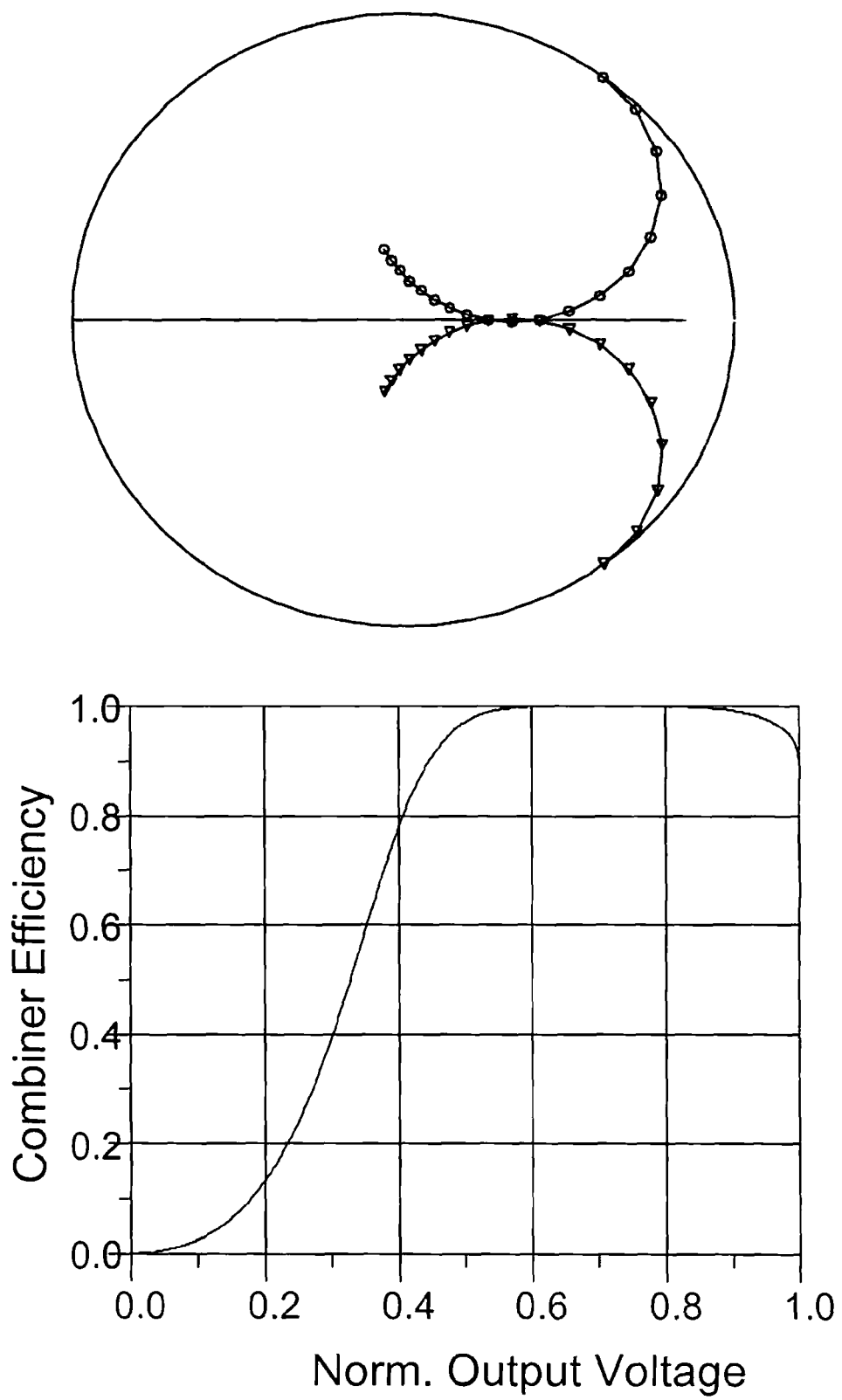

FIG. 4C illustrates yet another exemplary scenario of the instantaneous efficiency of a composite amplifier in accordance with an exemplary embodiment of the present invention. As seen, the instantaneous efficiency is increased as the impedance seen by one of the amplifiers of the composite amplifier is dynamically tuned. It should be noted that, in this exemplary embodiment, the impedance seen by an amplifier is a function of the reactance which in turn is a function of the outphasing angle φ, and therefore the impedance may be dynamically tuned by changing φ.

Figure 4D:
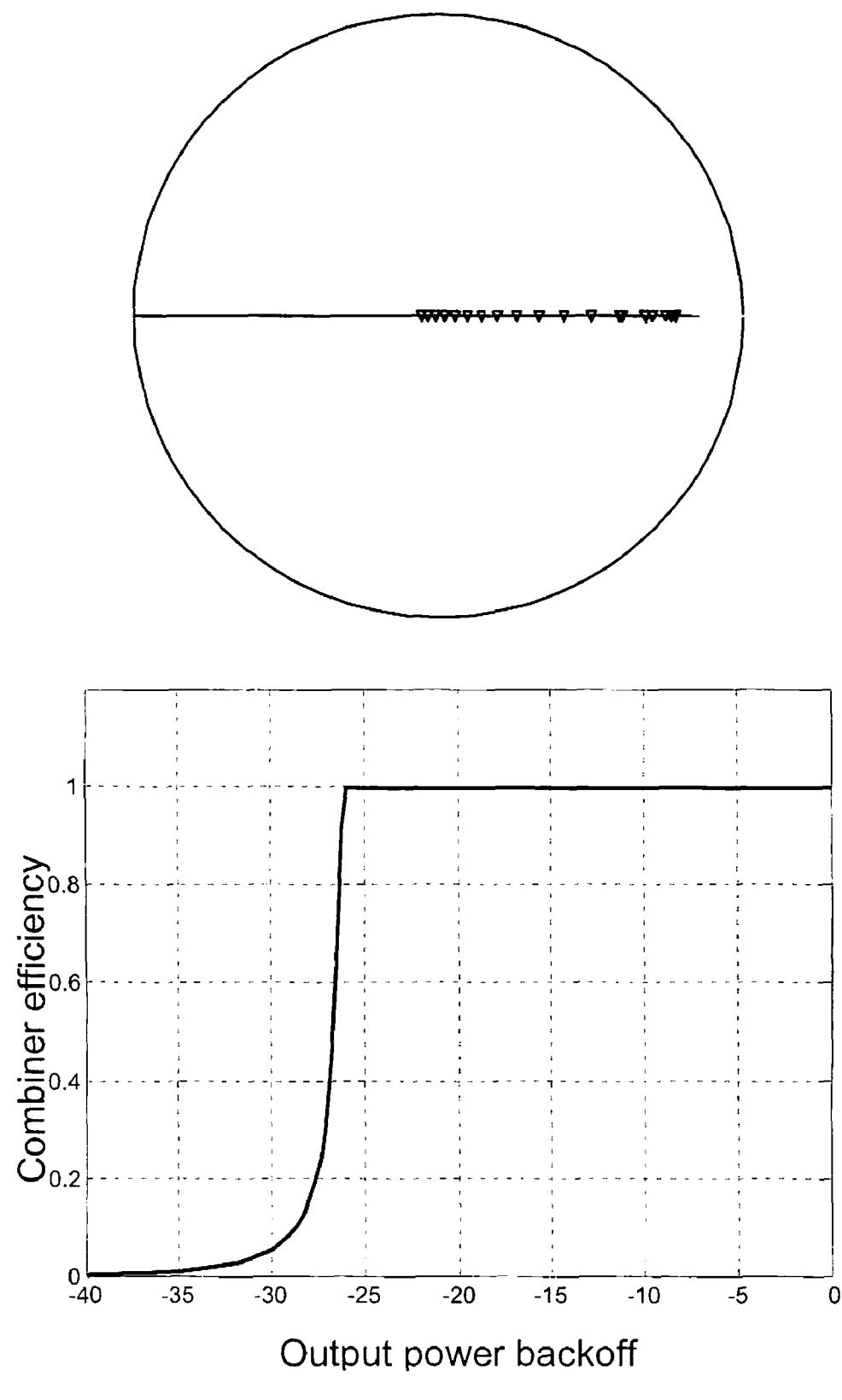

If, according to the present invention, one continuously controls the reactances or similarly continuously controls the impedance/admittance seen by each amplifier, the instantaneous efficiency of the composite amplifier as a function of the output power backoff (in dB), will resemble the efficiency curve shown in FIG. 4D. The corresponding Smith diagram is also illustrated.

From FIGS. 4A-4D we can deduct that the instantaneous efficiency of the composite amplifier is, according to embodiments of the present invention, increased when the impedance(s)/admittance(s) seen by the amplifiers are dynamically tuned. From FIGS. 4A-4D we can also conclude that the normalized output power level(s) where the instantaneous efficiency reaches local maxima is moved along with the envelope amplitude fluctuations of the output signal and the instantaneous efficiency is, according to embodiments of the present invention, maximized over a longer time than that of the envelope amplitude fluctuations of the output signal.

Thus, by letting the point(s), corresponding to the normalized output power level(s) where the instantaneous efficiency reaches local maxima, move or track the envelope amplitude of the signal at slower speed than that of the envelope speed, the instantaneous efficiency of the composite amplifier is increased and we can still be able to have amplitude headroom for quick upward excursions of the output signal. The composite amplifier according to the present invention thus decouples the efficiency maximum from the amplitude maximum.

Figure 5A:
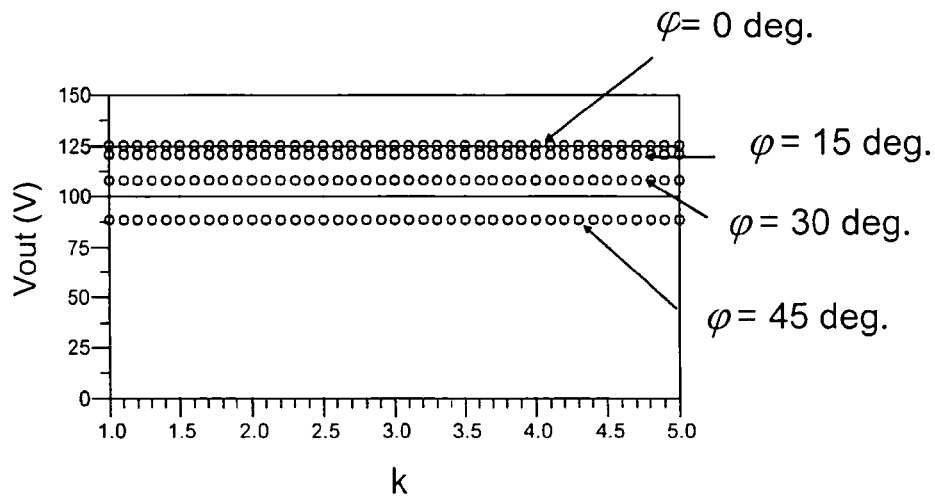
FIG. 5A illustrates an output voltage as a function of a scaling factor for different constant outphasing angles.
Figure 5B:
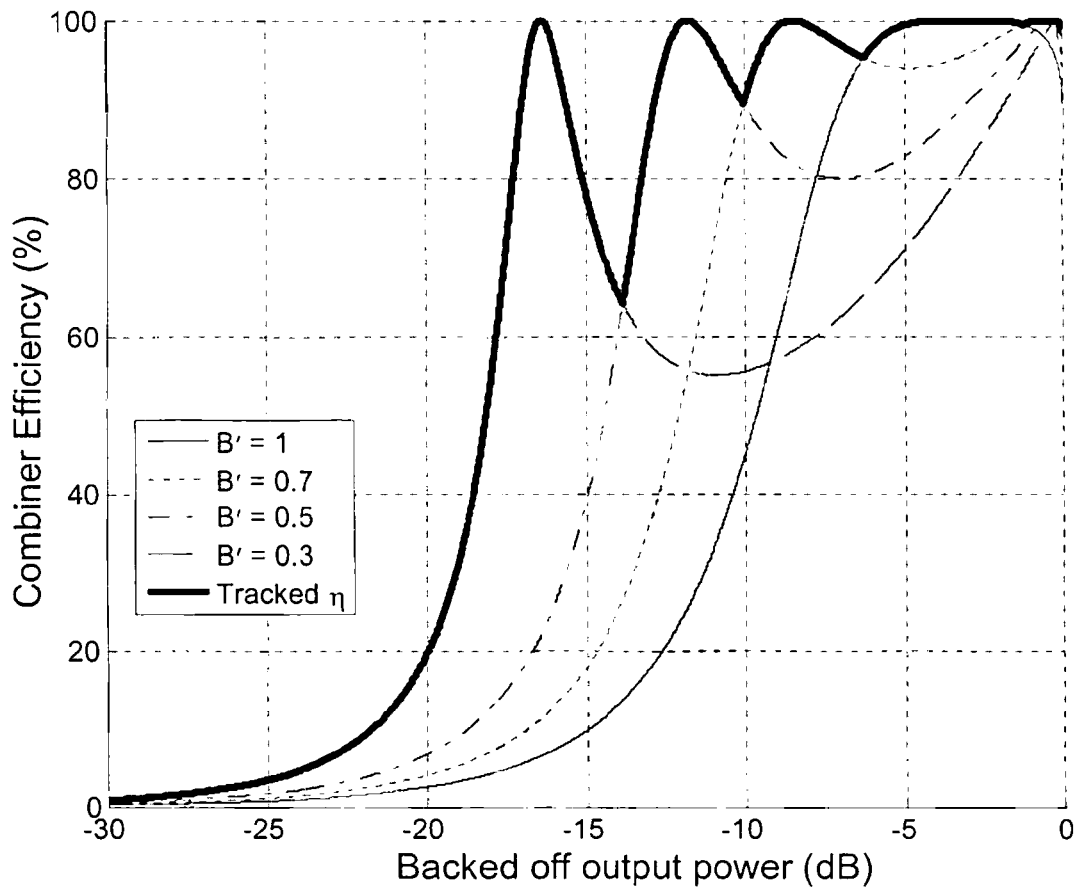
FIG. 5B illustrates an example of the instantaneous efficiency curves of a composite amplifier according to embodiments of the present invention.

According to another embodiment of the present invention, if the reactances of a composite amplifier comprising a pair of amplifiers of a Chireix outphasing system, are symmetrically retuned, the point(s), corresponding to the normalized output power level(s) where the instantaneous efficiency reaches local maxima, can be moved without altering the output signal of the composite amplifier. This scenario is illustrated in FIG. 5A where k represents a scaling constant that may be used to alter the impedance(s)/admittance(s) seen by each power amplifiers. In FIG. 5A, the output voltage is illustrated as a function of the scaling factor k for four different constant outphasing angles φ. Note that since the impedance(s)/admittance(s) seen by each power amplifiers are a function of B (or B') as presented in equations (6) and (7), the dynamic tuning/retuning of the impedances/admittances can be performed by changing B (or B'). This is illustrated in FIG. 5B which represents the instantaneous efficiency curves for different values of B'. In FIG. 5B, the impedance(s) seen by each power amplifier of a composite amplifier are, in accordance to embodiments of the present invention, dynamically tuned by altering B' within the interval [0.3, 1]. As can be observed in FIG. 5B, as the point(s) of high efficiency i.e. the point(s) corresponding to the output power level(s) where the instantaneous efficiency reaches local maxima is moved along with the envelope amplitude of the output signal, the instantaneous efficiency is increased. The instantaneous efficiency is thus arranged to be maximized over a longer time than of the envelope amplitude fluctuations of the output signal. Tracking of the instantaneous efficiency is also shown in FIG. 5B (thick line).

Figure 6A:
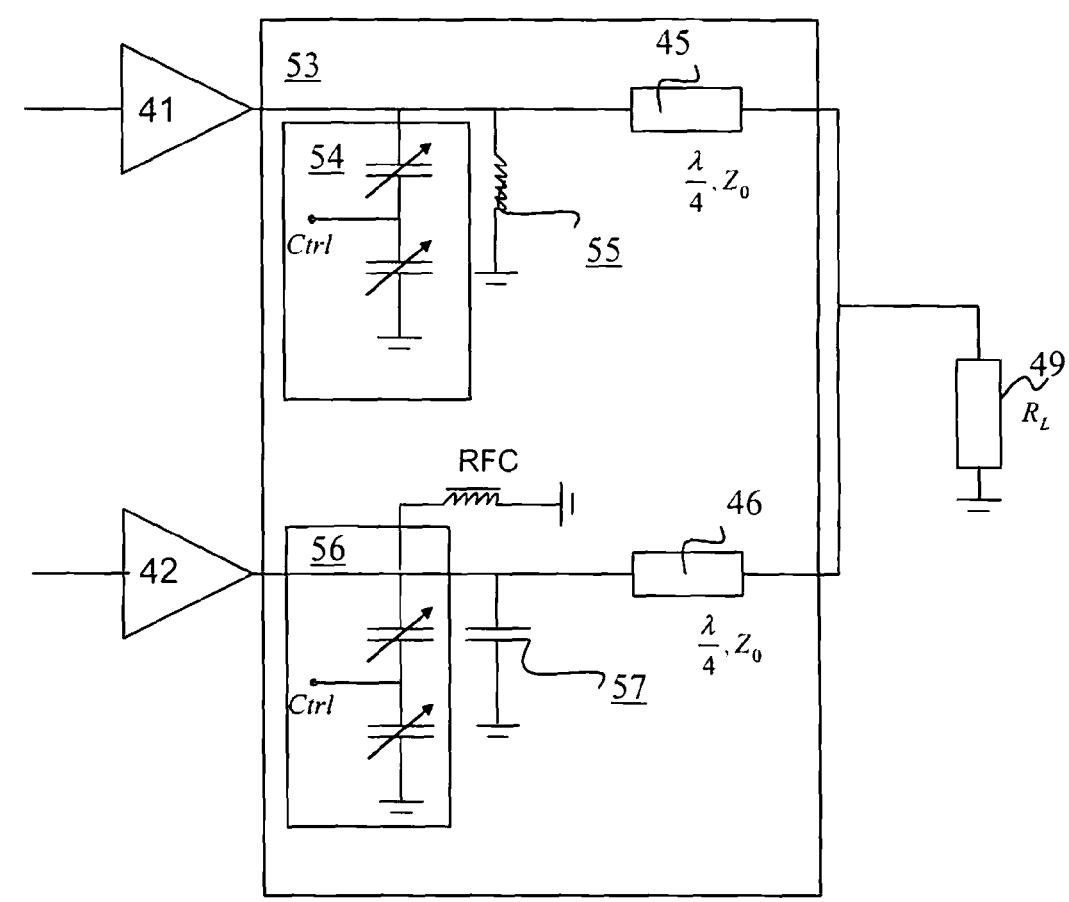
FIGS. 6A-6B illustrates different structures of a composite amplifier incorporating a Chireix outphasing system, in accordance with other embodiments of the present invention.
Figure 6B:
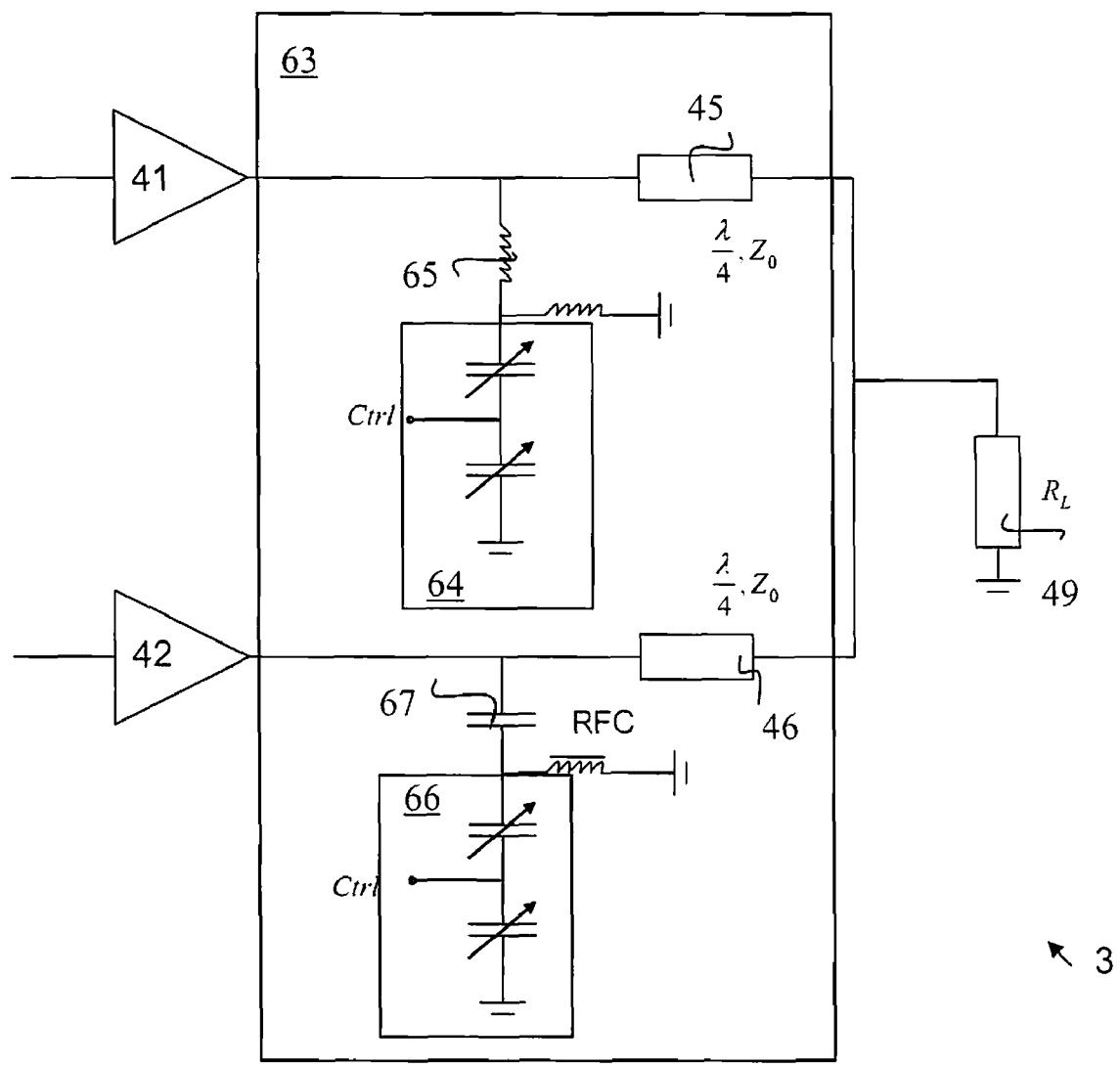

Referring now to FIGS. 6A-6B, there are illustrated two different structures of a composite amplifier according to two exemplary embodiments of the present invention. In both FIG. 6A and FIG. 6B, the composite amplifier 3 includes a pair of differently driven power amplifiers 41, 42 of a Chireix outphasing system.

In FIG. 6A, which represents an example of a parallel implementation of the composite amplifier 3, the combiner network 53, in accordance with another embodiment of the present invention, comprises a first varactor network 54 in parallel with a reactance 55 (an inductance) and a second varactor network 56 in parallel with another reactance 57 (a capacitance). Thus the impedance seen by amplifier 41 may be expressed as a function of the elements of the varactor network 54 and of the reactance 55. Similarly, the impedance seen by amplifier 42 may be expressed as a function of the elements of the varactor network 56 and of the reactance 57. By dynamically tuning/retuning the above mentioned impedances by e.g. dynamically tuning/retuning the varactor networks 54 and 56, we can increase the instantaneous efficiency of the composite amplifier 3. In other words, by tuning/retuning the varactor networks 54 and 56, we can move the point(s) corresponding to the output power level(s) where the instantaneous efficiency reaches local maxima. The load impedance 49 is also illustrated. The element denoted RFC in FIG. 6A represents DC (Direct Current) ground reference for the varactor(s)

In FIG. 6B, which represents an example of a series implementation of the composite amplifier 3, the combiner network 63, in accordance with another embodiment of the present invention, comprises a first varactor network 64 placed in series with the reactance 65 (an inductance), and a second varactor network 66 placed in series with the reactance 67 (a capacitance). Similarly to the parallel implementation described in conjunction with FIG. 6A, the instantaneous efficiency of the composite amplifier 3 is also here increased by tuning/retuning the impedance/admittance seen by amplifier 41 and the impedance/admittance seen by amplifier 42. The tuning performed thus moves the point(s) corresponding to the output power level(s) where the instantaneous efficiency reaches local maxima. The load impedance 49 is also illustrated. The element denoted RFC in FIG. 6B represents DC (Direct Current) ground reference for the varactor(s)

It should be noted that the composite amplifier according to the previously described exemplary embodiments of the present invention, is not restricted to the above illustrated implementations. As an example, the varactor network(s) may comprise a T-network comprising varactor diodes, a radio choke that may be arranged as an inductor such that the varactor's intermediate frequency (IF) control signal is isolated from a RF signal. The varactor diode may also have a variable capacitance being a function of a voltage impressed on terminals of the diode. The varactor network may also comprise a pair of Schottky diodes or a resistance having an appropriate resistance value e.g. within a range of 1-5 Mohms.

Figure 7A:
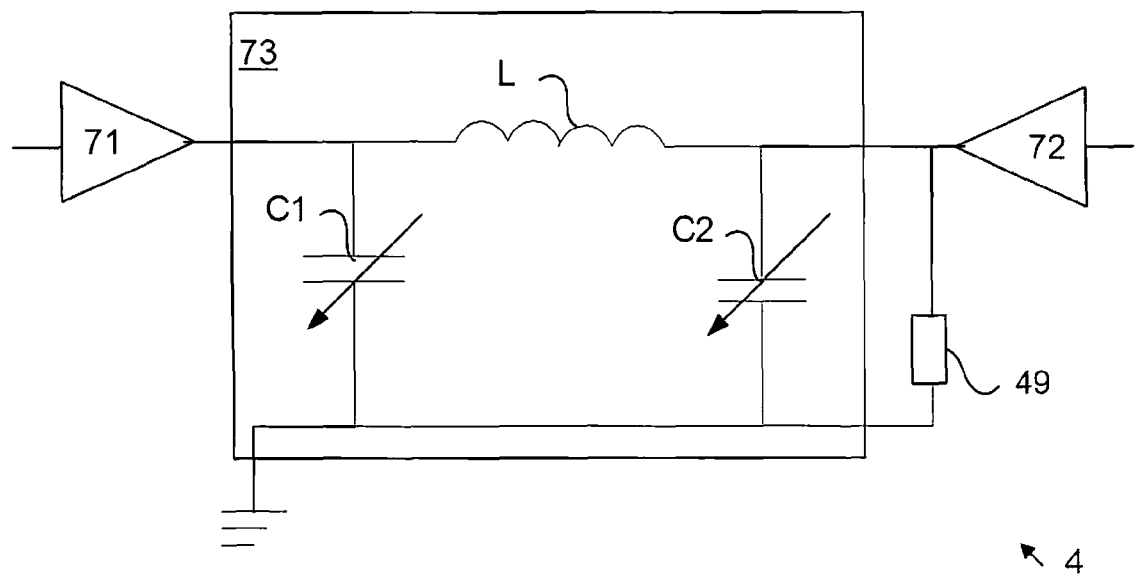
FIGS. 7A-7B illustrates different structures of a composite amplifier incorporating a Doherty amplifier, in accordance with other embodiments of the present invention.
Figure 7B:
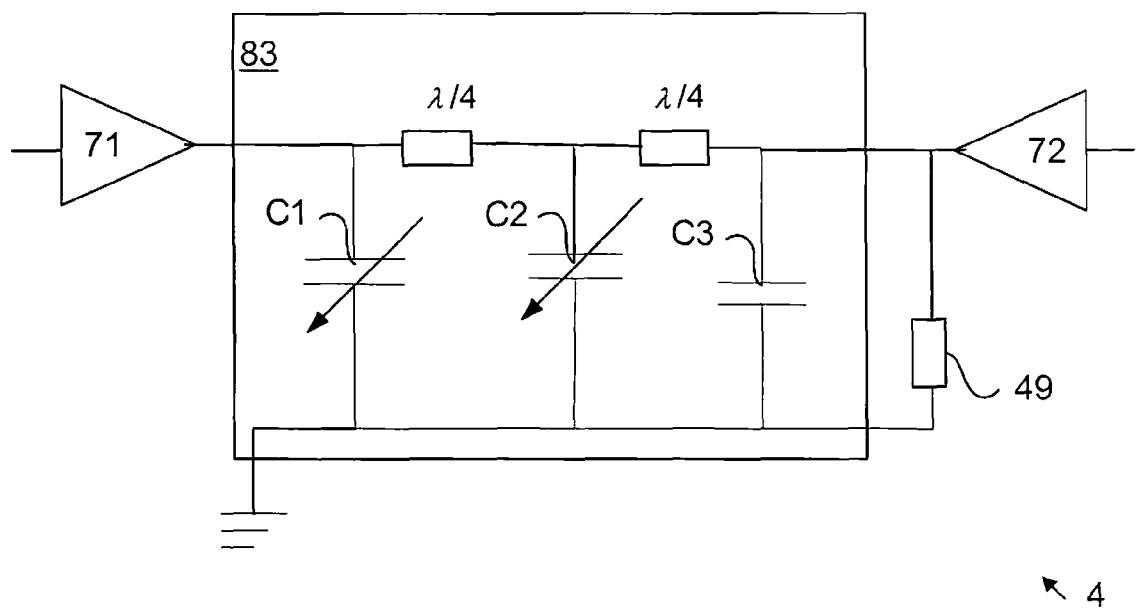

Referring to FIG. 7A-7B, there are illustrated two different structures of a composite amplifier according to other exemplary embodiments of the present invention. In both FIGS. 7A and 7B, the composite amplifiers 4, according to yet other exemplary embodiments of the present invention, include a pair of differently driven power amplifiers 71, 72 of a Doherty amplifier.

In FIG. 7A, the combiner network 73 of composite amplifier 4 comprises dynamically tuneable reactances C1, L and C2. The composite amplifier also comprises a load $R_{Load}$ 49 connected to the combiner network and two differently driven power amplifiers 71 and 72 of which power amplifier 71 represents the main amplifier of the Doherty amplifier whereas amplifier 72 represents the peak amplifier of the Doherty amplifier. The elements of the combiner network 73 i.e. C1, L and C2 are, as illustrated in FIG. 7A, forming a pi-network. Thus, the quarter-wave transmission line of the composite amplifier 4 is here represented as a pi-network. In this network, the impedance seen by the main amplifier 71 is configured to be tuned/retuned by altering e.g. C1 and L such that the instantaneous efficiency of the composite amplifier 4 is increased. It should be noted that all three elements of the pi-network may be tuned/retuned. In addition, it is also possible to design a pi-network as comprising of two inductances and one capacitance. Furthermore, a T-network or a L-network may also be used instead of a pi-network. The present invention is therefore not restricted to the structures presented in FIG. 7A and FIG. 7B.

In FIG. 7B another structure of a composite amplifier 4 is depicted. As seen, the combiner network 83 comprises a circuit including shunt capacitances C1, C2 and C3 and two quarter-wave transmission lines λ/4. In this exemplary embodiment of the present invention, the impedance seen by the main amplifier 71 is configured to be tuned/retuned by altering e.g. C1 and C2 such that the instantaneous efficiency of the composite amplifier 3 is increased. Again, all elements C1, C2 and C3 may also be tuned or retuned. Thus by dynamically tuning the elements of the combiner network that connects the main amplifier to the common output of the composite amplifier 4, we can make the efficiency maximum or the point(s) corresponding to the output power level(s) where the instantaneous efficiency reaches local maxima, track the instantaneous envelope amplitude of the output signal. The efficiency curves are illustrated in FIG. 8.

Figure 8:
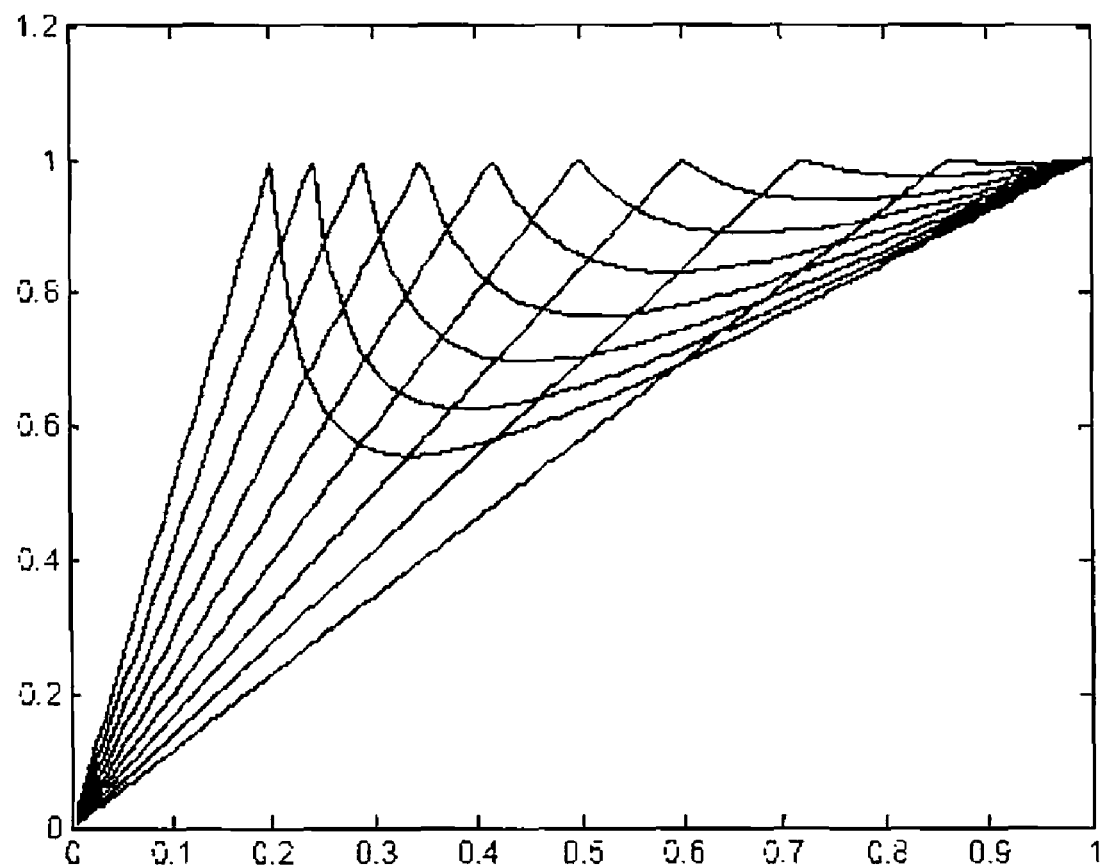
FIG. 8 illustrates the efficiency of a composite amplifier incorporating a Doherty amplifier.

From FIG. 8 we can see that the instantaneous efficiency of the composite amplifier is "pointed" rather than "rounded" which indicates that the efficiency of a composite amplifier comprised of a Doherty amplifier is less than that of a composite amplifier comprised of a Chireix outphasing system. However, similarly to the previously described exemplary embodiment of the composite amplifier comprised of a Chireix outphasing system, we can observe in FIG. 8 that, as the point(s) of high efficiency i.e. the point(s) corresponding to the output power level(s) where the instantaneous efficiency reaches local maxima is moved along with the envelope amplitude of the output signal, the instantaneous efficiency is increased. The instantaneous efficiency is thus also here arranged to be maximized over a longer time than of the envelope amplitude fluctuations of the output signal.

It should be noted that the composite amplifier comprising of a Doherty amplifier and the composite amplifier comprising of a Chireix outphasing system, experience different sensitivity to certain losses and they are therefore efficient for different situations. As an example and according to embodiments of the present invention, if substantial shunt losses are present at the output of the amplifiers the impedance seen by one of the amplifiers may be seen as a resistance, being substantially inversely proportional to the square of the output amplitude's envelope, in parallel with (generally slightly) varying shunt loss resistance (plus some residual resistance). Below a certain amplitude value at which said resistance is equal to the shunt loss resistance, the impedance(s) seen by one of the amplifiers is maintained fixed and linear drive i.e. linear fundamental output current and voltage, is used. In a composite amplifier incorporating a Doherty amplifier, the amplitude value mentioned above may occur at a power that is approximately $R_{LOAD}/2R_{SHUNT}$ of the maximum output power for the entire composite amplifier, where $R_{SHUNT}$ corresponds the shunt resistance of the composite amplifier. In a composite amplifier incorporating a Chireix outphasing system, the amplitude value mentioned above may occur at a power that is approximately $R_{LOAD}/R_{SHUNT}$ of the maximum output power for the entire composite amplifier.

In both cases above the impedance(s) seen by one of the amplifiers are configured to be tuned/retuned by e.g. changing a transformation ratio in the combiner network. According to embodiments of the present invention, the transformation ratio may be defined as the impedance seen at one end of the combiner network divided by the actual impedance at the other end of the combiner network. The transformation ratio may e.g. be changed by tuning elements of the combiner network, for example, by tuning/retuning one or several capacitances or other tuneable reactances of the combiner network.

Note that for a Doherty amplifier according to embodiments of the present invention, at the transition point, the voltage at the peak amplifier is substantially lower than that of the main amplifier, so the shunt loss of the peak amplifier is very small. The entire shunt loss at this transition point is therefore approximately half of that of the Chireix outphasing system, which gives the Doherty amplifier an advantage in case of large shunt loss (low transistor shunt resistance).

For a Chireix outphasing system both amplifiers have largely the same voltage which occurs at the amplitude value mentioned above. The loss from $R_{SHUNT}$ is therefore largely double that of the Doherty and the amplitude value can, as mentioned above, be calculated as being $R_{LOAD}/R_{SHUNT}$ of the maximum output power i.e. the same as for a single amplifier pure load modulation system.

We may therefore conclude that if shunt losses are relatively large, the composite amplifier comprised of a Doherty amplifier is considered more efficient than that of a composite amplifier comprised of a Chireix outphasing system. On the other hand, if no losses are present or if losses are mainly dependent on the output radio frequency current, the composite amplifier incorporating a Chireix outphasing system is considered more efficient than that of a composite amplifier incorporating a Doherty amplifier. Nevertheless, the efficiency or the instantaneous efficiency of the composite amplifiers is, according to embodiments of the invention, considered more efficient than that of prior art composite amplifiers. This is because of the dynamic matching, as described before, is incorporated into a composite amplifier. The dynamic matching is the dynamic tuning/retuning of the impedance(s) seen by each of the at least two differently driven power amplifiers of the composite amplifier. It should be noted that instead of dynamically tuning impedances, transimpedances may instead be tuned.

Figure 9:
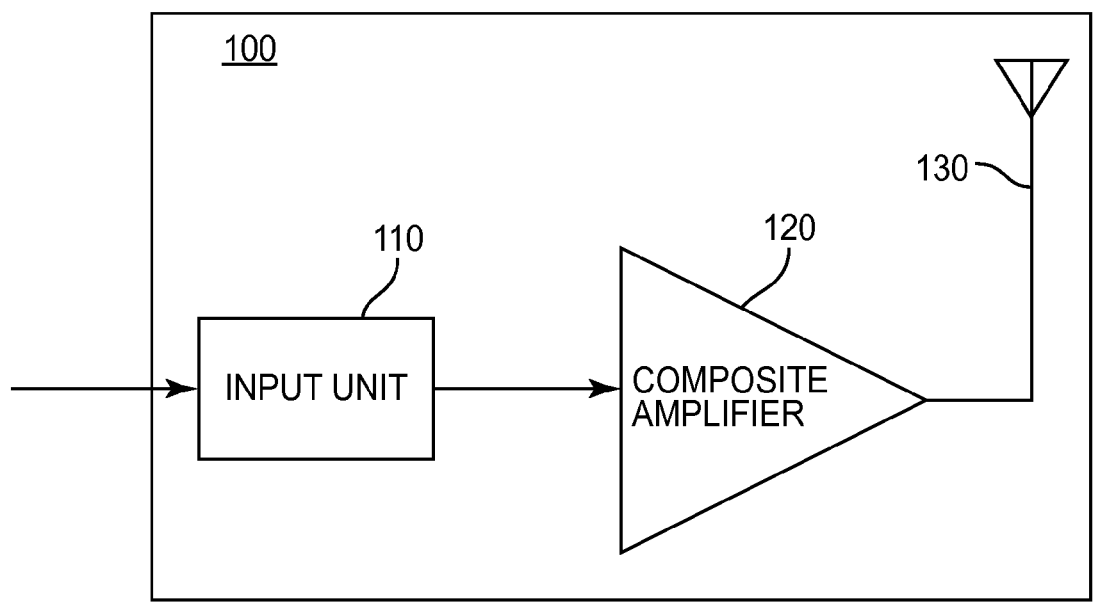
FIG. 9 is a block diagram illustrating a radio terminal including a composite amplifier according to exemplary embodiments of the present invention.

Referring to FIG. 9, there is illustrated a radio terminal 100 comprising a composite amplifier according to embodiments of the present invention. As shown in FIG. 9, the radio terminal 100 is provided with a composite amplifier 120 in accordance with embodiments of the present invention. An antenna 130 representing a load impedance, is also shown connected to the composite amplifier 120. In addition a general input unit 110 for receiving input signal/signals such as modulated RF signals is also depicted. Pre-processing operations on the input signal/signals, prior to forwarding it/them to the composite amplifier 130 are not described here since these are not necessary for understanding the different embodiments of the present invention. Furthermore, other elements, which are not considered relevant for the understanding of the present invention, have been omitted.

The radio terminal 100 illustrated in FIG. 9 may be part of mobile telephone: a radio base station or any other type of radio terminal that is suitable for a wireless system. As an example, the radio terminal 100 may be adapted for use in telecommunications wireless systems such as the JDC (Japanese Digital Cellular), GSM (Global System for Mobile Communications), GPRS General Packet Radio Service), EDGE (Enhanced Data rates for GSM Evolution), WCDMA (Wide band Code Division Multiplexing Access), CDMA (Code Division Multiplex Access), GPS (Global Positioning System), the WIMAX (Worldwide Interoperability for Microwave Access) or any other type of wireless system.

Although the present invention has been described with reference to a composite amplifier incorporating a Doherty amplifier or a Chireix outphasing system, it is evident that the invention is applicable to composite amplifiers with other type of amplifiers.

In addition, the present invention and its embodiments can be realised in many ways. For example, one embodiment of the present invention includes a computer-readable medium having instructions stored thereon that are executable by a computer system located in one or several radio terminals of a wireless system, for improving the instantaneous efficiency of a composite amplifier. The instructions executable by the computing system and stored on the computer-readable medium perform the method steps of the present invention as set forth in the claims.

While the invention has been described in terms several embodiments, it is contemplated that alternatives, modifications, permutations and equivalents thereof will become apparent to those skilled in the art upon reading of the specifications and study of the drawings. It is therefore intended that the following appended claims include such alternatives, modifications, permutations and equivalents as fall within the scope of the present invention.

The invention claimed is:

1. A composite amplifier for use in a radio terminal of a telecommunications wireless system, comprising:
   at least two power amplifiers that are arranged to be connected to an output combiner network and to a load, the output combiner network comprising at least one dynamically tunable reactance;
   wherein said at least two power amplifiers are configured to be differently driven;
   wherein at least one of the impedances seen by each of said at least two power amplifiers is arranged to be dynamically tuned via tuning of the at least one dynamically tunable reactance such that the instantaneous efficiency of the composite amplifier is increased; and
   wherein said at least one of the impedances seen by each of said at least two differently driven power amplifiers appears to at least one of the two differently driven power amplifiers as a resistance that is substantially inversely proportional to the square of the output signal amplitude's envelope of said composite amplifier.

2. The composite amplifier according to claim 1 wherein said at least one of the impedances seen by each of said at least two differently driven power amplifiers appears to at least one of the two differently driven power amplifiers as said resistance in parallel with a shunt loss resistance at the output of the composite amplifier.

3. The composite amplifier according to claim 2 wherein said at least one of the impedances seen by each of said power amplifiers is arranged to be maintained fixed when the amplitude of the output signal from the composite amplifier is below a certain amplitude value at which said resistance is equal to said shunt loss resistance whereby linear drive of said composite amplifier is used.

4. A method of increasing the instantaneous efficiency of a composite amplifier comprising at least two power amplifiers being connected to an output combiner network and to a load, said output combiner network comprising at least one dynamically tunable reactance, said method comprising:
   providing an input signal to each of the at least two power amplifiers of the composite amplifier, such that the at least two power amplifiers are differently driven; and
   dynamically tuning at least one of the impedances seen by each of said at least two power amplifiers via dynamic tuning of the at least one dynamically tunable reactance, such that the instantaneous efficiency of the composite amplifier is increased;
   wherein said at least one of the impedances seen by each of said at least two differently driven power amplifiers appears to at least one of the two power amplifiers as a resistance that is substantially inversely proportional to the square of the output signal amplitude's envelope of said composite amplifier.

5. The method according to claim 4 wherein said at least one of the impedances seen by each of said at least two differently driven power amplifiers appears to said at least one of the power amplifiers as said resistance in parallel with a shunt loss resistance at the output of the composite amplifier.

6. The method according to claim 5 further comprising maintaining said at least one of the impedances seen by each of said at least two differently driven power amplifiers fixed when the amplitude of the output signal from the composite amplifier is below a certain amplitude value at which said resistance is equal to said shunt loss resistance and further linearly driving said composite amplifier.

* * * * *

UNITED STATES PATENT AND TRADEMARK OFFICE
CERTIFICATE OF CORRECTION

PATENT NO. : 8,384,475 B2
APPLICATION NO. : 12/741432
DATED : February 26, 2013
INVENTOR(S) : Gustavsson et al.

It is certified that error appears in the above-identified patent and that said Letters Patent is hereby corrected as shown below:

On the Title Page, in Item (57), under "ABSTRACT", in Column 2, Line 7, delete "130). the" and insert -- 130). The --, therefor.

In the Specification

In Column 5, Line 41, delete "$Z_o$." and insert -- $Z_0$. --, therefor.

In Column 7, Line 32, delete "42," and insert -- 42. --, therefor.

In Column 7, Line 44, delete "is the" and insert -- $V_L$ is the --, therefor.

In Column 10, Lines 54-55, delete "varactor(s)" and insert -- varactor(s). --, therefor.

In Column 11, Line 4, delete "varactor(s)" and insert -- varactor(s). --, therefor.

In Column 13, Line 22, delete "telephone:" and insert -- telephone; --, therefor.

Signed and Sealed this
Twenty-fourth Day of September, 2013

Teresa Stanek Rea
*Deputy Director of the United States Patent and Trademark Office*